United States Patent [19]
Hwang

[11] Patent Number: 5,171,165
[45] Date of Patent: Dec. 15, 1992

[54] ELECTRICAL CONNECTOR INCORPORATING AN IMPROVED HOLD-DOWN DEVICE FOR SECURING TO A PRINTED CIRCUIT BOARD, OR THE LIKE

[75] Inventor: Jenq-Yih Hwang, San Jose, Calif.

[73] Assignee: Foxconn International, Sunnyvale, Calif.

[21] Appl. No.: 722,707

[22] Filed: Jun. 28, 1991

[51] Int. Cl.$^5$ ............................................. H01R 13/73
[52] U.S. Cl. ................................... 439/567; 439/571; 411/508; 411/913
[58] Field of Search ............... 493/557, 567, 571, 746, 493/747; 24/297; 403/405.1, 406.1; 411/508–510, 913

[56] References Cited

U.S. PATENT DOCUMENTS

| | | | |
|---|---|---|---|
| 4,668,040 | 5/1987 | Matsuzaki et al. | 439/557 |
| 4,681,389 | 7/1987 | Nakazawa et al. | 439/557 |
| 4,921,453 | 5/1990 | O'Brien | 439/931 |
| 4,943,244 | 7/1990 | Teck et al. | 439/567 |
| 4,969,842 | 11/1990 | Davis | 439/931 |
| 5,037,327 | 8/1997 | Van Woensel | 439/571 |
| 5,044,988 | 9/1991 | Hirayama | 439/571 |

FOREIGN PATENT DOCUMENTS 2628617  1/1977  Fed. Rep. of Germany ...... 439/557

Primary Examiner—Gary F. Paumen
Attorney, Agent, or Firm—Lyon & Lyon

[57] ABSTRACT

An electrical connector incorporates a resilient hold-down device for securely fastening the electrical connector to an associated printed circuit board or the like. The hold-down device is capable of repeated insertion and removal into the printed circuit board without the danger of failure or fracturing which could cause unreliability in the electrical connections between the connector and the printed circuit board. The hold-down device comprises a horizontal base, a pair of spaced arms bent upwardly at a right angle from opposite sides of the base in substantially parallel relationship, and a pair of legs, spaced apart from one another extending downwardly and bent downward at a right angle along the longitudinal edge of the base. The legs also have side projections for engagement with the periphery of an aperture in the printed circuit board. Retention lugs are formed from portions of the upwardly extending arms and are bent outwardly to resiliently engage the sides of receiving apertures in the insulator body of the electrical connector. Shoulder means for engagably retaining the lugs are provided in the receiving apertures of the insulator body of the electrical connector. This enables the hold-down device to be readily inserted into the base of the insulator body. The plane of the surface defined by the parallel upwardly extending arms is disposed orthogonally to the plane of the major surface of the downwardly depending legs, thereby increasing the stability of the connection between the electrical connector and the printed circuit board. The base of the hold-down means mounts squarely against the base of the electrical connector and provides a stable supporting platform for the legs which insert into the printed circuit board.

13 Claims, 2 Drawing Sheets

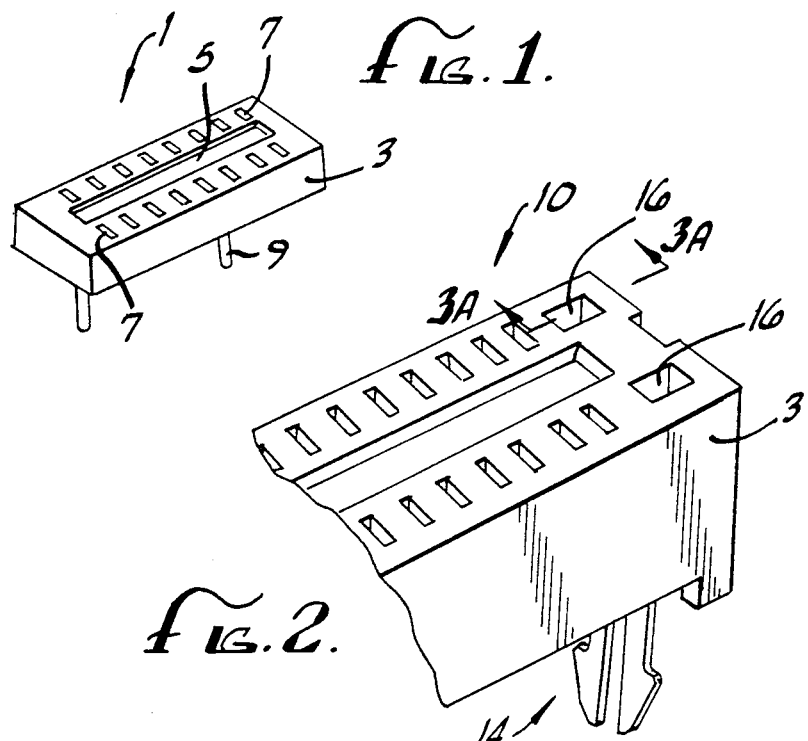
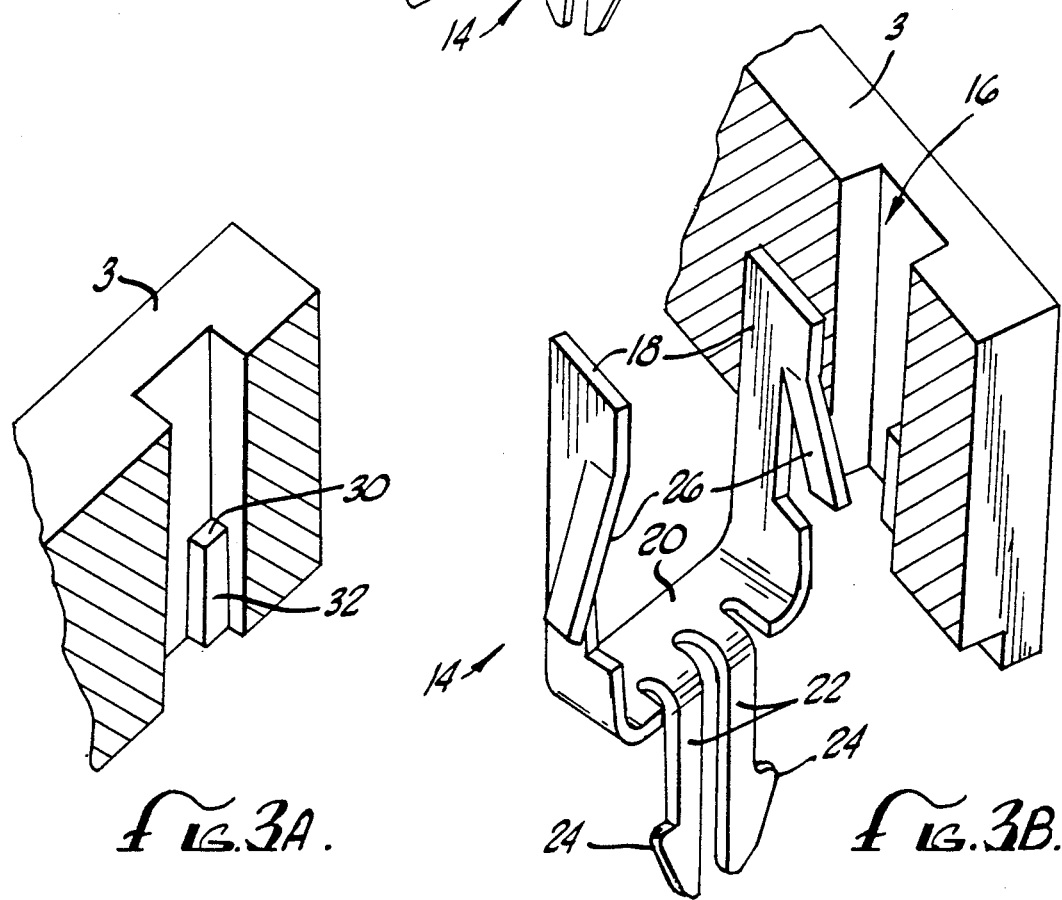

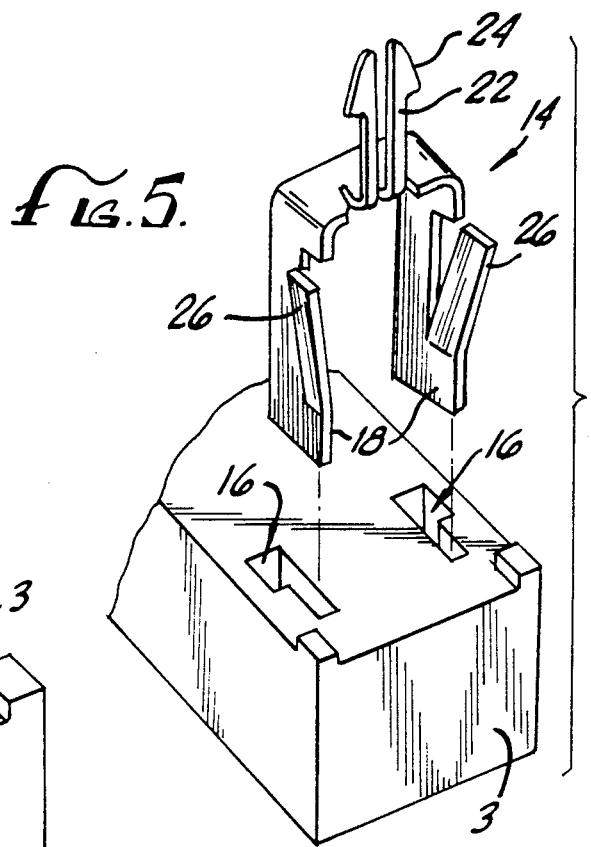
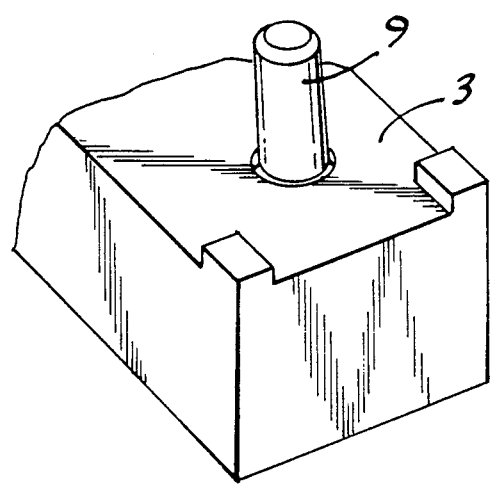
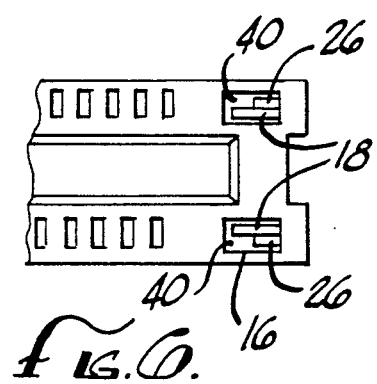
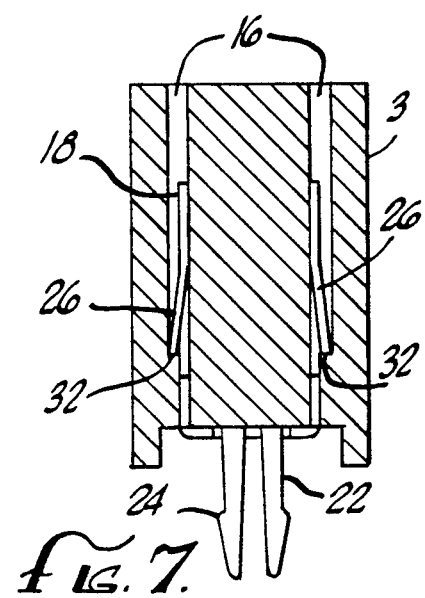

ELECTRICAL CONNECTOR INCORPORATING AN IMPROVED HOLD-DOWN DEVICE FOR SECURING TO A PRINTED CIRCUIT BOARD, OR THE LIKE

BACKGROUND OF THE INVENTION

1. Field Of The Invention

The field of the present invention generally relates to a hold-down device for securing an electrical connector. More particularly, the field of the present invention relates to a resilient hold-down device for repeated mounting of a connector to a printed circuit board, microprocessor board, or the like.

2. The Prior Art

The conventional method of mounting an electrical connector to a printed circuit board is by means of a post provided integrally with the lower surface of the insulating housing of the electrical connector. For example, when the insulating housing is comprised of a plastic material, the prior art hold-down device consists of a post, integrally formed from the plastic housing. The hold-down function is achieved by an interference fit between the post and a corresponding insert opening on the printed circuit board. The connector must be pressed downward so that the plastic post fits into a corresponding opening in the printed circuit board in order to secure the connector on the printed circuit board. Although the prior art interference fit hold-down device can mount an electrical connector tightly on the printed circuit board, such an interference fit plastic post may present problems.

Among the drawbacks of an interference fit device is the limited dimensional tolerance allowed between the post and the corresponding aperture on the printed circuit board. The problem of maintaining the precisely allowable tolerance between the post and opening is such that even modest variation in the dimension of post or insert opening may cause insufficient retention capability and may result in an unreliable electrical connection between the connector and printed circuit board. Even a slight dimensional variation also may result in excessive interference between the post and opening. This makes it difficult if not impossible to insert the post into the printed circuit board without danger of breaking off or fracturing the post and thereby rendering the entire connector useless.

In order to avoid the foregoing problem, it is necessary to impose significant manufacturing constraints to prevent dimensional variations from occuring during the manufacturing process. This in turn has the disadvantage of significantly increasing the difficulty and cost of manufacturing.

Another disadvantage of a typical interference fit hold-down device arises from the dissimilar thermal expansion coefficients between the integrally molded plastic mounting post and the printed circuit board. When the thermal expansion coefficients of the plastic mounting post and the printed circuit board are sufficiently different, the insert opening on the printed circuit board may apply a force to the free end of the post and cause fracturing or failure of the mounting post.

Another problem of a conventional hold-down device molded from plastic material is that plastic is easily scratched or otherwise subject to abrasion. Also, the conventional hold-down post tends to crack easily during an inappropriate insert-extract operation due to the lack of flexibility of the plastic or the insulating material. A plastic mounting post is also subject to failure after it has been used repeatedly to mount an electrical connector on a printed circuit board. In particular, when a connector is subjected to frequent use involving repeated cycles of insertion and extraction, the risk of failure of the plastic post is greatly increased.

What is needed therefore is a mounting means or hold-down device for securing an electrical connector to a printed circuit board which is not subject to breaking, fracturing or other structural failure. It would be desirable to form a hold-down device from a material having resilient characteristics which could be used over many cycles of insertion and extraction without failure. Because most electrical connectors utilize insulating materials which are not made from resilient materials, it is desirable to manufacture separately a mounting or hold-down device having the desired resilient characteristics, and then insert the hold-down device into the insulator housing of the electrical connector after the electrical connector has been completely assembled and is ready for mounting.

U.S. Pat. No. 4,681,389 is an example of a conventional hold-down device which avoids the use of an integrally formed plastic post. This patent discloses a metal lock pin for mounting an electrical connector to a printed circuit board or the like. However, this device has a significant limitation because it must be inserted from above to hold an upper shoulder surface provided on the insulator body of the electrical connector. A portion of the lock pin then extends downwardly through the electrical connector to engage an opening of the printed circuit board.

This arrangement has limited application because it only can be used to secure an electrical assembly which has a laterally extending shoulder portion. The shoulder portion of the electrical connector is necessary to provide the retaining surface which enables the lock pin to hold the connector assembly in place. Most electrical connectors are simple rectangular blocks without shoulders. Adding a shoulder in order to provide a surface for securing the connector increases manufacturing costs and uses up valuable space on a printed circuit board layout. In addition, the shoulder of the electrical connector assembly is structurally weak because it must be thin or narrow in order to allow the legs of the lock pin to have sufficient space to engage the opening in the printed circuit board. In practice, the plastic shoulder of such an electrical connector is usually very thin and subject to structural failure when exposed to vibration, rough treatment or harsh operating conditions.

Another disadvantage of a conventional hold-down device exemplified by U.S. Pat. No. 4,681,389 is that all elements of the lock pin are aligned in a common plane and define a single longitudinal axis. Because the lock pin device is typically very thin, the single plane surface lacks stability when subjected to torsional or lateral forces.

In addition, the manufacturing process necessary to produce a typical electrical connector assembly housing capable of holding perhaps hundreds of pins is complex. It is therefore desirable to maintain extreme simplicity in the manufacturing of the connector housing. For this reason, electrical connector housings are usually formed as rectangular blocks. It would be difficult, in terms of manufacturing steps and increased cost, to manufacture a housing with a shoulder structure sufficiently large to provide a stable retaining surface for such a prior art lock pin device.

Also, any insertion difficulty in loading a conventional hold-down device creates a potential for fracturing or otherwise weakening the thin plastic shoulder. And, the typically thin plastic shoulder configuration is not adapted to multiple insertion/extraction operations. The lack of structural integrity inherent in such prior art hold-down devices potentially creates unreliability in the electrical connections and may shorten the useful lifetime of the electrical connector assembly.

Therefore, what is needed is an improved hold-down device for securing an electrical connector to a printed circuit board or the like. The hold-down device preferably should have a flexible structure and not be subject to breaking or fracturing. The hold-down device also should have flexibility to allow a greater tolerance in the attachment dimensions of the hold-down means and the insertion aperture in the printed circuit board. What is also needed is a hold-down device which can be easily manufactured and assembled in a variety of electrical connectors in order to reduce manufacturing complexity and costs. It would also be desirable to provide an electrical connector hold-down device with increased capability for multiple reinsertion in a printed circuit board. This would advantageously enhance the useful lifetime of an electrical connector incorporating such a hold-down device.

SUMMARY OF THE INVENTION

According to a first aspect of the present invention, there is provided an improved hold-down device for securing an electrical connector assembly to a printed circuit board or the like. The electrical connector assembly secured by the device typically comprises a plurality of electrical contacts provided in an insulating housing. An opening is provided, typically at each end of the insulating housing, for engagably receiving a resilient portion of the insertable hold-down device.

The hold-down device is formed from a material, having a certain amount of elasticity, and comprises a horizontal base, a pair of spaced apart arms bent upwardly at a right angle from opposite sides of the base in substantially parallel relationship with one another, and a pair of downwardly extending legs, bent downward at a right angle along at least one longitudinal edge of the base. The downwardly extending legs form a plane surface for engaging a corresponding aperture in the printed circuit board which is orthogonal to the plane surface formed by the upwardly extending arms. The downwardly extending legs are provided with resilient side projections.

The arms are each provided with a resilient, outwardly extending retention member for engaging with a receiving cavity in the insulator housing of the electrical connector. The cavity is provided with a shoulder portion for engageably holding the retention member so that the electrical connector may be strongly secured to the printed circuit board.

According to another aspect of the invention, the retention members are configured so that when engaging the shoulder portion of the cavity, a drain opening is provided. The drain opening advantageously enables a cleaning solvent or water to be drained out of the connector.

BRIEF DESCRIPTION OF THE DRAWINGS

FIG. 1 is a perspective view of the plastic housing of a prior art electrical connector.

FIG. 2 is a perspective view of an electrical connector incorporating the present invention.

FIG. 3A is a perspective view of the receiving portion of the insulator housing of an electrical connector incorporating the present invention.

FIG. 3B is a perspective view of the hold-down device of the present invention and a receiving portion of the electrical connector insulator housing.

FIG. 4 shows a prior art electrical connector housing and its integral hold-down device FIG. 5 is a partial exploded perspective view of the electrical connector of the present invention and its insertion position with respect to the plastic housing.

FIG. 6 is a top view of an electrical connector incorporating the present invention.

FIG. 7 is a cross-sectional view of the hold-down device of the present invention in place in the insulator body of an electrical connector.

DETAILED DESCRIPTION

Referring now to FIGS. 1 and 4, a typical prior art electrical connector 1 comprises an insulator housing 3 consisting of plastic or other insulating material. The insulator housing 3 is provided with a longitudinal slot 5. A plurality of sockets 7 are generally arranged in rows on the top surface of the electrical connector housing. Each socket 7 is provided with an electrical contact for a connection to an associated daughter board. A plurality of contacts, not shown, generally depend downward from the base of the insulating housing 3.

A conventional hold-down device typically comprises at least one post 9 extending downwardly from the base of the insulator housing 3 for securing the electrical connector 1 to an associated printed circuit board. The post 9 is usually plastic and is integrally formed from the plastic insulator housing 3. The post 9 attaches the connector I onto the printed circuit board by means of an interference fit between post 9 and a corresponding insertion aperture in the printed circuit board. To make a secure connection between the printed circuit board and the electrical connector, it is necessary to apply a great deal of force to the top surface of the insulator housing 3 in order to force the post 9 into the insertion aperture on the printed circuit board.

It is generally recognized that a conventional interference fit hold down device suffers from problems of inflexibility and unreliability. Because the post 9 is integrally formed from the insulator housing 3, it is stationary and cannot be adjusted in order to accommodate an insertion aperture of a printed circuit board which may be dimensionally different from or spaced apart from the post.

It is well known that the process of assembling the electrical connector 1 onto the printed circuit board must be done with great care in order to avoid damage to the plastic post 9. Any dimensional variation between the post 9 and the corresponding insertion aperture (not shown) or uneven application of insertion force exposes the post 9 to deformation or breakage. This may result in unreliability of the connection between the electrical connector 1 and associated daughter boards or the printed circuit board.

Referring now to FIGS. 2, 3A, 5, 6 and 7 there is shown an electrical connector assembly 10 incorporating the improved hold-down device of the present invention. As shown in FIG. 2, the electrical connector 10 comprises a plurality of contacts on the underside thereof (not shown), an insulator housing 3, typically of plastic, for receiving the plurality of contacts and a hold-down device 14 for mounting the electrical connector on a printed circuit board. There are at least two cavities 16 provided in the insulator housing 3, each for receiving one of the upwardly extending arms 18 of the hold-down device 14. As shown more clearly in FIGS. 3B and 5 the hold-down device 14 includes a horizontal, flat base 20. Integral therewith are a pair of spaced-apart upwardly extended arms 18. Arms 18 are bent upwardly at a right angle from opposite sides of the base 20 in a substantially parallel relationship. A pair of legs 22 extend downward from the base 20 and are bent downward at a substantially right angle along a longitudinal edge of the base 20. Legs 22 have a pair of side projections 24 for engagement for a periphery and insert opening in an associated printed circuit board (not shown).

Referring again to FIG. 3B, the hold-down device 14 further comprises retention lugs 26 which depend downward and outwardly from arms 18. Lugs 26 are provided for engagement with the corresponding upper surface 30 of shoulders 32 formed at the periphery of the hold-down device receiving aperture 16 which is provided in the insulator housing 12 of the electrical connector 10 as shown in FIGS. 3 and 3B. Only one shoulder 32 is shown for the sake of simplicity. Two shoulders are provided, one in each of the hold-down device receiving aperture 16.

The hold-down device 14 according to the present invention is inserted into apertures 16 through the bottom side of the insulator housing 12 as shown in FIG. 5. It will be appreciated from FIGS. 3B and 5 that the two parallel arms 18 fit conformably within the apertures 16. Apertures 16 also include shoulders 32 which engage the outwardly extending arm portions 26. Because the entire hold-down device 14 is formed from a single piece of resilient material such as metal, outwardly extending portions 26 apply a pressure outwardly against the sides of the aperture 16 and engage shoulders 32 to provide an extremely stable fit.

The planes of the major surfaces of arms 18 are parallel. The arms 18 fit conformably within the aperture 16 to provide extremely good resistance to applied torsional or lateral forces. In this regard, the surface of the plane formed by legs 22 is orthogonal to the plane of the surfaces formed by arms 18 and retention lugs 10. The substantially orthogonal juxtaposition of the respective engaging surfaces formed by legs 22 and arms 18 provides much improved lateral stability and resistance to applied torsional forces in comparison to those devices wherein all engagement surfaces lie in a single plane. Accordingly, an electrical connector embodying the hold-down device 14 of the present invention has improved connective stability with respect to a printed circuit board, daughter board, or the like. This improved stability and resistance to applied torsional or lateral forces stabilizes the electrical connection between the printed circuit board, electrical connector and any daughter board connected thereto. This also increases the reliability of a printed circuit board layout using the improved hold-down device of the present invention.

As may be appreciated from a comparison of a conventional hold-down device shown in FIG. 4 and the present invention as depicted in FIGS. 3B and in FIG. 5, the present invention provides greater resistance to torsional twisting than does the typical integral hold-down post 9. Also, because the present invention is made of a resilient material, it enables an electrical connector to be repeatedly inserted and removed into a receiving aperture in a printed circuit board without the danger of failure. This enhances the useful lifetime of an electrical connector. This aspect of the present invention also reduces manufacturing costs because the receiving apertures in the printed circuit board do not have to be precisely dimensionally aligned with the hold-down device.

Another aspect of the present invention provides a manufacturing advantage because the hold-down device 14 is stamped from a single, flat piece of resilient material such as metal. Alternatively, hold-down device 14 could be formed from any resilient material, including plastic. The present invention also provides the advantage of ease of assembly over known prior art hold-down devices. Conventional hold-down devices usually must be inserted from above in order to engage the shoulders of an insulator body.

In contrast, in the present invention, the arms 18 with their retention lugs 26 are fitted from below into receiving apertures 16 in an insulator body 3 of an electrical connector. The retention lugs hold the electrical connector from within and eliminate the need for manufacturing an insulator body with shoulder portions in order to provide a retention means such as in the prior art. The present invention may be used with any electrical connector having a simplified block construction. It does not necessitate a specially molded insulator body having external shoulders to be used as retention means. Accordingly, the present invention also reduces the manufacturing costs of an electrical connector.

In accordance with another aspect of this invention as shown in FIGS. 6 and 7, the retention lugs 26 and arms 18 do not completely fill the opening defined by slot 16. As the hold-down device 14 is inserted into the receiving slot 16 and insulator housing 12, the retention lugs 26 are resiliently pressed against the outer wall at aperture 16. As shown in FIG. 6, the lugs 26 resiliently extend outwardly to engage the shoulders 32. The retention lugs 26 also override the upper surface of shoulders 32 as shown in FIG. 7. This leaves a drain opening 40 within the apertures 16. The drain opening 40 advantageously allows a cleaning fluid such as water to be drained out of the electrical connector 10 during the cleaning process after the connector 10 has been soldered onto a printed circuit board. The drain hole 40 enables a cleaning fluid to be completely removed from the connection 10 after assembly. This results in improved reliability of the connection between the electrical connector and printed circuit board.

Thus, an improved hold down device has been described in 17 connection with what is presently considered to be the most practical and preferred embodiments. It is to be understood that the device is not limited to the disclosed embodiment but, on the contrary is intended to cover various modifications and equivalent arrangements included within the spirit and scope of the appended claims. For example, in the embodiment described above, the hold-down device 14 is formed of a metal material. However, the hold-down device 14 may be formed from any resilient material, even plastic, which has sufficient elasticity and strength. In such an equivalent structure the present device still provides superior stability with respect to applied lateral and torsional forces. Therefore, persons of ordinary skill in this field are to understand that all such equivalent structures are to be included within the scope of the following claims.

What is claimed is:

1. An improved hold-down means for securing an electrical connector or the like to a printed cirucit board wherein the electrical connector is characterized by an insulator housing have a plurality of apertures, each for receiving at least one of a corresponding plurality of contacts, and said insulator housing further comprising at least one aperture for receiving the hold-down means, said improved hold-down means further comprising:
   a horizontal base being parallel to and disposed at a bottom surface of said housing;
   a pair of spaced-apart arms depending upwardly at a right angle from opposite sides of said base in substantially parallel relationship; each arm having at least one retention lug means for engaging the periphery of said receiving aperture;
   a pair of spaced-apart legs extending downwardly along a longitudinal edge of and at a right angle to said base, said legs including side projections for engagement with the periphery of a corresponding aperture in said printed circuit board for selectively securing said insulator housing to said printed circuit board.

2. A hold-down device as in claim 1 wherein said pair of upwardly extending arms include outwardly extending retention lugs on the distal ends thereof for engagement with the periphery of said corresponding receiving aperture in the electrical connector.

3. The hold-down means according to claim 2 wherein each receiving aperture of the electrical connector is provided with a corresponding shoulder means for engaging said outwardly depending retention lugs for securely holding said hold-down device within said electrical connector.

4. The hold-down means according to claim 3 wherein said arms, legs and retention lugs are formed from a single metal plate.

5. The hold-down means according to claim 3 wherein said arms, legs and retention lugs are integrally molded from a single piece of synthetic resin material.

6. An improved hold-down device for securing an electrical connector to a printed circuit board, or the like, wherein the electrical connector comprises an insulator body having a plurality of apertures extending therethrough, each aperture having at least one corresponding electrical contact therein, and wherein the opposite ends of each aperture define a pin and socket, respectively, said insulator further having at least one receiving aperture for receiving said hold-down device, said hold-down device comprising:
   a base;
   a pair of resilient arms each lying in a plane and extending upwardly from opposite ends of said base, each arm being conformably received by a receiving aperture of said insulator;
   a pair of legs extending downwardly at a right angle along a longitudinal edge of said base, said legs defining a surface lying in a planes substantially orthogonal to the plane of said upwardly extending arms;
   each of said legs provided with at least one side projection for engaging with a corresponding aperture in said printed circuit board.

7. The hold-down device according to claim 6 wherein said hold-down receiving aperture in said insulator extends entirely therethrough and provides an opening for draining off a cleaning solution when said electrical connector is soldered to said printed circuit board.

8. The hold-down device according to claim 6 wherein said hold-down device is stamped and formed from a single piece of metal.

9. The hold-down device according to claim 6 wherein said hold-down device is molded from a single piece of synthetic resin material.

10. An improved electrical connector incorporating an insertable hold-down means for repeatedly securing said connector to a printed circuit board or the like comprising:
    an insulator defining a first surface, two side surfaces, a bottom surface, a longitudinal axis and a plurality of through holes extending from said bottom surface to said first surface, each through hole having one corresponding electrical contact extending therethrough;
    at least a pair of cavities positioned transversely to said longitudinal axis, said cavities being parallel to each other and to the side surface of the insulator;
    a resilient hold-down means for securing said bottom surface of the insulator to said printed circuit board, said hold-down means comprising:
    a pair of parallel, substantially flat resilient arms, each arm being conformably received by the corresponding cavity of said insulator and a major surface of each arm defining a plane parallel to the side surfaces of the insulator; and
    at least one substantially flat leg extending out of the bottom surface of the insulator and a major surface of the leg defining a plane substantially orthogonal to the planes defined by the arms; and
    wherein the hold-down means further includes a horizontal base positioned in abutment with the bottom surface of the insulator and having two longitudinally opposite ends from which the arms extend upwardly, the leg extending downwardly along a longitudinal edge of said base.

11. The connector as described in claim 10 wherein said pair of upwardly extending arms include outwardly extending retention lugs on the respective distal ends thereof, and each cavity forms a shoulder for engagement with said lug for securely holding said hold-down means within said electrical connector.

12. The connector as described in claim 11 wherein a slot extends through said leg to form a pair of opposite tangs, each of said tangs provided with at least one side projection for engaging with a corresponding aperture in said circuit board.

13. The connector as described in claim 10 wherein said cavities in said insulator provide an opening for draining off excess fluid when said electrical connector is soldered to said printed circuit board.

* * * * *